(12) United States Patent
Li

(10) Patent No.: US 11,127,925 B2
(45) Date of Patent: Sep. 21, 2021

(54) OLED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Zhao Li, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/847,944

(22) Filed: Apr. 14, 2020

(65) Prior Publication Data
US 2021/0210722 A1  Jul. 8, 2021

(30) Foreign Application Priority Data
Jan. 3, 2020  (CN) .......................... 202010006396.6

(51) Int. Cl.
*H01L 51/52* (2006.01)
*H01L 27/32* (2006.01)
*H01L 51/00* (2006.01)

(52) U.S. Cl.
CPC ...... *H01L 51/5253* (2013.01); *H01L 27/3258* (2013.01); *H01L 51/0097* (2013.01);
(Continued)

(58) Field of Classification Search
CPC ............. H01L 51/5253; H01L 51/5246; H01L 51/5256; H01L 51/5237; H01L 51/0097; H01L 27/3258; H01L 27/3244; H01L 27/3262; H01L 27/323; H01L 27/3246; H01L 27/3276; H01L 2227/323; H01L 2251/5338
See application file for complete search history.

(56) References Cited

U.S. PATENT DOCUMENTS 10,998,523 B2  5/2021  Lv
2012/0256202 A1  10/2012  Cho et al.
(Continued)

FOREIGN PATENT DOCUMENTS

CN  106299154 A  1/2017
CN  106876328 A  6/2017
(Continued)

*Primary Examiner* — Michael M Trinh

(57) ABSTRACT

The present invention provides an organic light-emitting diode (OLED) display panel, the OLED display panel comprises a display region and a non-display region, and the OLED display panel comprises a flexible substrate, a thin film transistor (TFT) layer, an OLED light-emitting layer, and a thin film packaging layer. The thin film packaging layer comprises a first inorganic layer, an organic layer, and a second inorganic layer. Wherein the first inorganic layer and the second inorganic layer respectively extend from the display region to the non-display region, a portion of the first inorganic layer located in the non-display region comprises a porous array structure, and a portion of the second inorganic layer located in the non-display region covers the first inorganic layer and fills the porous array structure.

10 Claims, 1 Drawing Sheet

(52) U.S. Cl.
 CPC ...... *H01L 27/3244* (2013.01); *H01L 51/5256* (2013.01); *H01L 2251/5338* (2013.01)

(56) References Cited

U.S. PATENT DOCUMENTS

| | | | |
|---|---|---|---|
| 2014/0291641 A1* | 10/2014 | Negishi | H01L 27/3258 257/40 |
| 2016/0043346 A1* | 2/2016 | Kamiya | H01L 51/5246 257/40 |
| 2016/0285038 A1* | 9/2016 | Kim | H01L 51/5237 |
| 2017/0331073 A1* | 11/2017 | Choi | H01L 27/3248 |
| 2019/0181381 A1* | 6/2019 | Sun | H01L 51/56 |
| 2019/0237525 A1* | 8/2019 | Zhao | H01L 51/0023 |
| 2019/0363146 A1* | 11/2019 | Takahashi | H01L 27/3246 |
| 2020/0279902 A1 | 9/2020 | Xiong | |

FOREIGN PATENT DOCUMENTS

| | | |
|---|---|---|
| CN | 207441754 U | 6/2018 |
| CN | 108470761 A | 8/2018 |
| CN | 109119449 A | 1/2019 |
| CN | 109728164 A | 5/2019 |
| CN | 109817681 A | 5/2019 |
| CN | 109860411 A | 6/2019 |
| CN | 110335959 A | 10/2019 |
| CN | 110335964 A | 10/2019 |
| CN | 110534548 A | 12/2019 |

* cited by examiner

OLED DISPLAY PANEL

FIELD OF INVENTION

The present disclosure relates to the field of display technology, and more particularly, to an organic light-emitting diode (OLED) display panel.

BACKGROUND OF INVENTION

At present, the development of organic light-emitting diode (OLED) display technology is rapid. OLED products have received more and more attention and applications due to their advantages such as lightness, fast response, wide viewing-angles, high contrast, bendability, etc., and are mainly applied in display fields such as mobile phones, tablets, and televisions.

However, OLED devices are more sensitive to water and oxygen, and penetration of water and oxygen has a great impact on the lifespan of the devices, so strict packaging is required. At present, in the field of flexible OLED display, OLED display panel have better anti-bend performance, that is, the OLED display panel can still maintain good display performance in a bending state, without accelerating aging failure. Thus, packaging layers must have strong adhesion, and can better release internal stress of packaging films, without peeling between the film layers in a bending state, thereby effectively preventing water and oxygen from invading the OLED device from a peeling location and causing the OLED oxidation to fail. However, the packaging layer of the current OLED display panel uses an alternating structure (inorganic-organic-inorganic), after the display panel is bent, and peeling between the film layers inside the packaging film layer, which are located in an edge region, is easy to occur, resulting in packaging failure.

In summary, there are technical problems that the packaging layer of the current OLED display panel adopts the alternating structure (inorganic-organic-inorganic), after the display panel is bent, peeling between the film layers inside the packaging film layer which are located in edge region is easy to occur, resulting in causing the OLED device to be oxidized and reducing the performance of the OLED device life.

SUMMARY OF INVENTION

Embodiments of the present disclosure provides an organic light-emitting diode (OLED) display panel, which can enhance adhesion between inorganic layers in an edge region of a packaging structure of the OLED display panel, to solve that there are technical problems that the packaging layer of the current OLED display panel adopts the alternating structure (inorganic-organic-inorganic), after the display panel is bent, peeling between the film layers inside the packaging film layer which are located in edge region is easy to occur, resulting in causing the OLED device to be oxidized and reducing the performance of the OLED device life.

An embodiment of the present disclosure provides an OLED display panel comprising a display region and a non-display region, wherein the OLED display panel comprises a flexible substrate, a thin film transistor (TFT) layer, an OLED light-emitting layer, and a thin film packaging layer. The thin film packaging layer comprises a first inorganic layer, an organic layer, and a second inorganic layer.

Wherein, the first inorganic layer and the second inorganic layer respectively extend from the display region to the non-display region, a portion of the first inorganic layer located in the non-display region comprises a porous array structure, and a portion of the second inorganic layer located in the non-display region covers the first inorganic layer and fills the porous array structure.

In some embodiments, the porous array structure comprises a plurality of circular through-holes, and a diameter of each of the circular through-holes ranges from 20 µm to 30 µm.

In some embodiments, an interval between adjacent circular through-holes ranges from 40 µm to 50 µm.

In some embodiments, the organic layer is disposed between the first organic layer and the second organic layer, and an edge of the organic layer near the non-display region does not cross the porous array structure.

In some embodiments, the first inorganic layer and the second inorganic layer are made of silicon nitride.

In some embodiments, the organic layer is made of polymethyl methacrylate.

In some embodiments, a thickness of the first inorganic layer ranges from 1 µm to 2 µm, and a thickness of the second inorganic layer located in a portion of the display region is equal to the thickness of the first inorganic layer.

In some embodiments, the first inorganic layer and the second inorganic layer are both formed by chemical vapor deposition.

In some embodiments, a thickness of the organic layer ranges from 6 µm to 12 µm.

In some embodiments, the organic layer is formed on the first inorganic layer by spray coating.

In the OLED display panel provided in the embodiment of the present disclosure, a double-layer inorganic layer in the edge region of packaging structure thereof is disposed as a through-hole array structure, which enhances adhesion between the inorganic layers in the edge region of the packaging structure of the OLED display panel, and releases internal stress of the packaging film in the edge region, thereby improving an ability of the packaging film layer for blocking water and oxygen, reducing risk of oxidation of devices inside the display panel, and improving the life of OLED devices.

DESCRIPTION OF DRAWINGS

The following detailed description of specific embodiments of the present disclosure will make technical solutions and other beneficial effects of the present disclosure obvious in conjunction with the accompanying drawings.

DETAILED DESCRIPTION OF PREFERRED EMBODIMENTS

Figure 1:
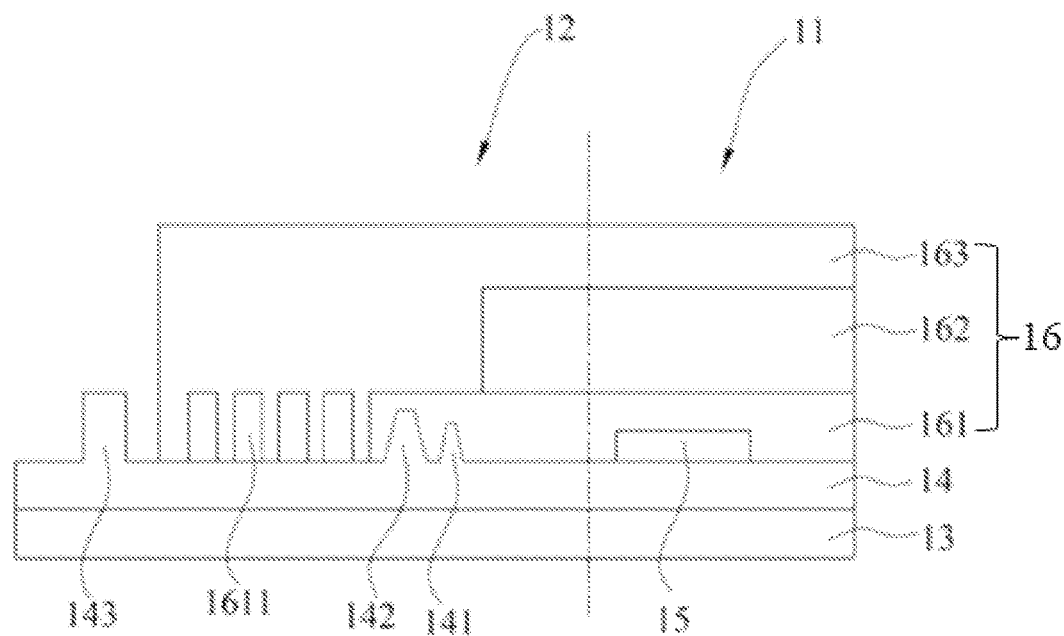
FIG. 1 is a schematic sectional structural diagram of an OLED display panel provided by an embodiment of the present disclosure.

The technical solutions in the embodiments of the present disclosure will be clearly and completely described below in conjunction with the accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

In descriptions of the present disclosure, it should be noted that, orientations or position relationships indicated by the terms, such as "center", "longitudinal", "transverse", "length", "width", "thickness", "upper", "lower", "front", "back", "left", "right", "vertical", "horizontal", "top", "bottom", "inside", "outside", "clockwise", "counterclockwise", etc. are based on the orientations or position relationships shown in the drawings. These are only convenience for describing the present disclosure and simplifying the descriptions, and does not indicate or imply that the device or element must have a specific orientation, a structure and an operation in the specific orientation, so it cannot be understood as a limitation on the present disclosure. In addition, the terms "first" and "second" are used for describing purposes only, and cannot be understood as indicating or implying relative importance or implicitly indicating the number of technical features indicated. Thus, the features defined as "first" and "second" may explicitly or implicitly include one or more of the features. In the descriptions of the present disclosure, the meaning of "plurality" is two or more, unless it is specifically defined otherwise.

In the present disclosure, the terms "mounting", "connected", "fixed" and the like should be broadly understood unless expressly stated or limited otherwise. For example, it may be fixed connected, removably connected, or integrated; it may be mechanically connected, or an electrically connected; it may be directly connected, or indirectly connected through an intermediary; it may be a connection between two elements or an interaction between two elements. For those skilled in the art, the specific meanings of the above terms in the present disclosure may be understood based on specific situations.

In the present disclosure, unless explicitly stated and defined otherwise, the first feature may be "above" or "below" the second feature and may include direct contact between the first and second features. It may also include that the first and second features are not in direct contact but are contacted by another feature between them. Moreover, the first feature is "above" the second feature, including the first feature directly above and obliquely above the second feature, or merely indicates that the first feature is higher in level than the second feature. The first feature is "below" the second feature, including the first feature is directly below and obliquely below the second feature, or only indicates that the first feature is less horizontal than the second feature.

The following disclosure provides many different embodiments or examples for achieving different structures of the present disclosure. To simplify the present disclosure, components and settings of specific examples are described below. They are only examples and are not intended to limit the present disclosure. In addition, the present disclosure may repeat reference numbers and/or reference letters in different examples, this repetition is for the purpose of simplicity and clarity, and does not itself indicate the relationship between various embodiments and/or settings discussed. In addition, the present disclosure provides examples of various specific processes and materials, but those of ordinary skill in the art may be aware of the present disclosure of other processes and/or the use of other materials.

Embodiments of the present disclosure are directed to the technical problems that the packaging layer of the current OLED display panel adopts the alternating structure (inorganic-organic-inorganic), after the display panel is bent, peeling between the film layers inside the packaging film layer which are located in edge region is easy to occur, resulting in causing the OLED device to be oxidized and reducing the performance of the OLED device life. The present embodiment can solve the defect.

As shown in FIG. 1, which is a schematic sectional structural diagram of an OLED display panel provided by an embodiment of the present disclosure. Wherein, the OLED display panel comprises a display region 11 and a non-display region 12, and the OLED display panel comprises a flexible substrate 13, a thin film transistor (TFT) layer 14, an OLED light-emitting layer 15, and a thin film packaging layer 16. The thin film packaging layer 16 comprises a first inorganic layer 161, an organic layer 162, and a second inorganic layer 163.

Specifically, the first inorganic layer 161 and the second inorganic layer 162 respectively extend from the display region 11 to the non-display region 12, a portion of the first inorganic layer 161 located in the non-display region 12 comprises a porous array structure 1611, and a portion of the second inorganic layer 163 located in the non-display region 12 covers the first inorganic layer 161 and fills the porous array structure 1611.

First, in the present disclosure, the field-effect thin film transistor (TFT) layer 14 is disposed on the flexible substrate 13, and the TFT layer 14 comprises a gate metal layer, a gate insulating layer, an active layer, a source/drain metal layer, a planar layer, and a passivation layer. A first retaining wall 141, a second retaining wall 142, and a third retaining wall 143 are respectively disposed on the TFT layer 14, a height of the second retaining wall 142 is greater than a height of the first retaining wall 141, and a height of the third retaining wall 143 is greater than the height of the second retaining wall 142, and then after the TFT layer 14 is disposed on the flexible substrate 13, the OLED light-emitting layer 15 is disposed on the TFT layer 14.

Figure 2:
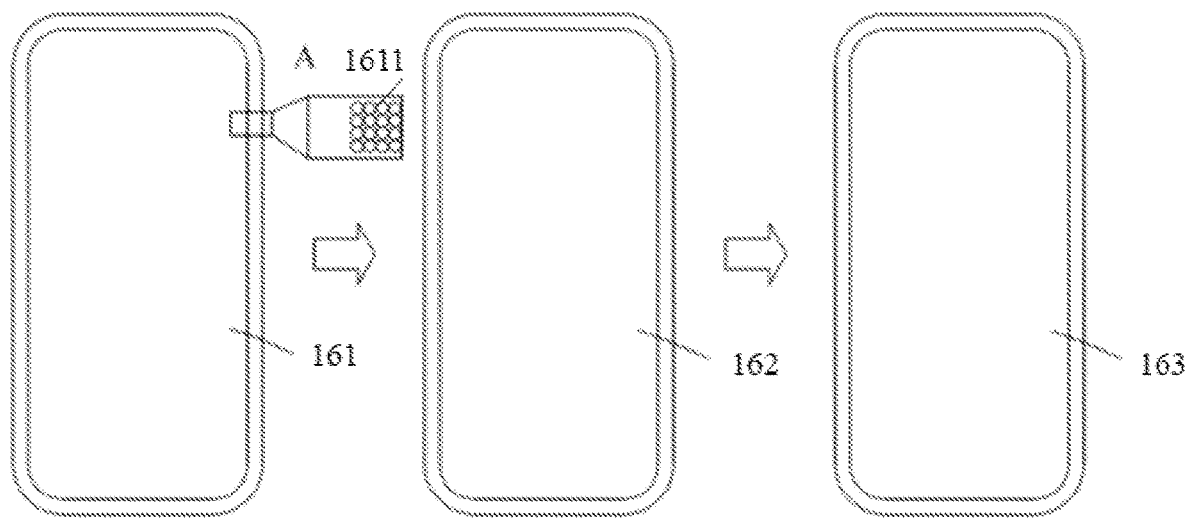
FIG. 2 is a top view of a packaging film layer in the OLED display panel provided by the embodiment of the present disclosure.

As shown in FIG. 2, which is a top view of a packaging film layer in the OLED display panel provided by the embodiment of the present disclosure. It is known form combing FIG. 1 and FIG. 2, a first inorganic layer 161 is deposited on the TFT layer 14 and the OLED light-emitting layer 15, the first inorganic layer 161 covers the first retaining wall 141 and the second retaining wall 142, and a portion of the first inorganic layer 161 located in the non-display region 12 is the porous array structure 1611 (enlarged part at A).

Preferably, the porous array structure 1611 comprises a plurality of circular through-holes, a diameter of each of the circular through-holes ranges from 20 µm to 30 µm, and an interval between adjacent circular through-holes ranges from 40 µm to 50 µm.

Preferably, the first inorganic layer 161 is made of an inorganic material, such as an inorganic thin film such as silicon nitride (SiNx) or aluminum oxide. The first inorganic layer 161 is a hydrophilic film. A thickness of the first inorganic layer 103 preferably ranges from 1 µm to 2 µm, such as 1.5 µm. The first inorganic layer 161 is preferably made by a chemical vapor deposition (CVD) process. A portion of the first inorganic layer 161 located in the non-display region 12 is formed through a mask of a circular array shielding structure to form the porous array structure 1611.

After the first inorganic layer 161 is deposited on the TFT layer 14, the organic layer 162 is deposited on a surface of the first inorganic layer 161. The organic layer 162 is made of an organic polymer, and is preferably polymethyl methacrylate (PMMA). A thickness of the organic layer 162 is greater the thickness of the first inorganic layer 161, and preferably ranges from 6 µm to 12 µm, such as 8 µm. The organic layer 162 is formed on the first inorganic layer 161 by spray coating.

Preferably, PMMA and photopolymerization initiator are mixed at a certain ratio to form printing ink, and then the ink is dropped on the first inorganic layer 161, and the ink is cured after leveling to form the organic layer 162. An edge of the organic layer 162 near the non-display region 12 does not cross the porous array structure 1611. Preferably, the edge of the organic layer 162 near the non-display region 12 does not cross the first retaining wall 141. The organic layer 162 mainly plays a role of planarizing and blocking water and oxygen transmission.

After the organic layer 162 is deposited on the first inorganic layer 161, the second inorganic layer 163 is deposited on the organic layer 162. The second inorganic layer 163 is made of an inorganic material, such as alumina, silicon dioxide, or silicon nitride, and is preferably silicon nitride. A thickness of the second inorganic layer 163 located in the portion of the display region 11 is equal to the thickness of the first inorganic layer 161, and is preferably 1 to 2 µm, such as 1.5 µm. The second inorganic layer is formed by chemical vapor deposition. The second inorganic layer 163 completely covers the organic layer 162, and the second inorganic layer 163 and the first inorganic layer 161 are directly connected in a peripheral region, that is, a portion of the second inorganic layer 163 located in the non-display region 12 covers the first inorganic layer 161 and fills the porous array structure 1611, and the edge of the second inorganic layer 163 near the non-display region 12 does not cross a position of the first retaining wall 143. The method provides that, on the one hand, the organic layer 162 is sealed in two inorganic layers to prevent water and oxygen from penetrating into the organic layer 162 from the surrounding region, on the other hand, a hole structure (pin-hole) is formed in an edge region of the thin film packaging layer 16, and the pin-hole structure can enhance adhesion between the inorganic layers in the edge region, and reduce risk of peeling between the inorganic layers.

In the OLED display panel provided by the embodiment of the present disclosure, the packaging film layer in the edge region is designed as hole structures. In the edge region of the packaging film layer of the OLED display panel, adhesion between the inorganic layers is enhanced, and internal stress of packaging film in the edge region is effectively released, resulting in reducing risk of peeling between the inorganic layers, improving an ability of the packaging film layer for blocking water and oxygen, and further improving bending performance of OLED display panels.

The embodiment of the present disclosure enhances adhesion between the inorganic layers in the edge region of the packaging structure of the OLED display panel, and releases internal stress of the packaging film in the edge region, thereby improving an ability of the packaging film layer for blocking water and oxygen, reducing risk of oxidation of devices inside the display panel, and improving the life of OLED devices.

In the above embodiments, the description of each embodiment has its own emphasis. For a part that is not described in detail in an embodiment, refer to the description of other embodiments.

The OLED display panel provided by the embodiments of the present disclosure have been described in detail above. The present disclosure uses specific examples to describe principles and embodiments of the present disclosure. The descriptions of the above embodiments are only used to help understand technical solutions of the present disclosure and core ideas thereof. Moreover, those of ordinary skill in the art should understand that the technical solutions described in the aforesaid embodiments can still be modified, or have some technical features equivalently replaced. However, these modifications or replacements do not depart from a scope of the technical solutions of the embodiments of the present disclosure.

What is claimed is:

1. An organic light-emitting diode (OLED) display panel, comprising a display region and a non-display region, wherein the OLED display panel comprises a flexible substrate, a thin film transistor (TFT) layer, an OLED light-emitting layer, and a thin film packaging layer stacked in sequence;
   wherein the thin film packaging layer comprises a first inorganic layer, an organic layer, and a second inorganic layer stacked in sequence, and a first retaining wall, a second retaining wall, and a third retaining wall are disposed on the TFT layer in the non-display region in sequence from a side adjacent to the display region to a side away from the display region; and
   the first inorganic layer and the second inorganic layer extend from the display region to the non-display region, a portion of the first inorganic layer located in the non-display region comprises a porous array structure positioned between the second retaining wall and the third retaining wall, and a portion of the second inorganic layer located in the non-display region covers the first inorganic layer and fills the porous array structure to form a pin-hole structure.

2. The OLED display panel as claimed in claim 1, wherein the porous array structure comprises a plurality of circular through-holes, and a diameter of each of the circular through-holes ranges from 20 µm to 30 µm.

3. The OLED display panel as claimed in claim 2, wherein an interval between adjacent circular through-holes ranges from 40 µm to 50 µm.

4. The OLED display panel as claimed in claim 1, wherein the organic layer is disposed between the first organic layer and the second organic layer, and an edge of the organic layer near the non-display region does not cross the porous array structure.

5. The OLED display panel as claimed in claim 1, wherein the first inorganic layer and the second inorganic layer are made of silicon nitride.

6. The OLED display panel as claimed in claim 1, wherein the organic layer is made of polymethyl methacrylate.

7. The OLED display panel as claimed in claim 1, wherein a thickness of the first inorganic layer ranges from 1 µm to 2 µm, and a thickness of the second inorganic layer located in the display region is equal to the thickness of the first inorganic layer.

8. The OLED display panel as claimed in claim 1, wherein a thickness of the organic layer ranges from 6 µm to 12 µm.

9. The OLED display panel as claimed in claim 1, wherein an edge of the portion of the second inorganic layer located in the non-display region does not cross a position of the third retaining wall.

10. The OLED display panel as claimed in claim 4, wherein the edge of the organic layer near the non-display region does not cross the first retaining wall.

* * * * *